(12) United States Patent
Inoue et al.

(10) Patent No.: US 12,575,265 B1
(45) Date of Patent: Mar. 10, 2026

(54) ORGANIC LIGHT-EMITTING DIODE DISPLAY WITH OPTICAL CAVITIES AND SILVER ANODES

(71) Applicant: Apple Inc., Cupertino, CA (US)

(72) Inventors: Naoya Inoue, Los Gatos, CA (US); Takahide Kuranaga, Tokyo (JP); Wookyung Bae, San Jose, CA (US); Alexandru Riposan, Palo Alto, CA (US); Kanuo C Kustra, San Jose, CA (US); Chi-Jui Chung, Santa Clara, CA (US); Teruo Sasagawa, Los Gatos, CA (US); Xiaodan Zhu, Fremont, CA (US); Michael Slootsky, Santa Clara, CA (US); Gloria Wong, San Jose, CA (US); Jaein Choi, San Jose, CA (US); Sunggu Kang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 850 days.

(21) Appl. No.: 17/829,995

(22) Filed: Jun. 1, 2022

Related U.S. Application Data

(60) Provisional application No. 63/243,637, filed on Sep. 13, 2021.

(51) Int. Cl.
*H10K 59/80* (2023.01)
*H10K 59/12* (2023.01)
(Continued)

(52) U.S. Cl.
CPC ....... *H10K 59/122* (2023.02); *H10K 59/1201* (2023.02); *H10K 59/80515* (2023.02);
(Continued)

(58) Field of Classification Search
None
See application file for complete search history.

(56) References Cited

U.S. PATENT DOCUMENTS

| | | | |
|---|---|---|---|
| 5,554,911 A | 9/1996 | Nakayama et al. | |
| 6,917,159 B2 | 7/2005 | Tyan et al. | |

(Continued)

FOREIGN PATENT DOCUMENTS

| | | |
|---|---|---|
| CN | 101874317 A | 10/2010 |
| CN | 106935624 A | 7/2017 |

(Continued)

*Primary Examiner* — Sue A Purvis
*Assistant Examiner* — Seyon Ali-Simah Punchbeddell
(74) *Attorney, Agent, or Firm* — Treyz P.C.; Joseph F. Guihan; Jinie M. Guihan

(57) ABSTRACT

Pixels in an organic light-emitting diode (OLED) display may be microcavity OLED pixels having optical cavities. The optical cavities may be defined by a partially transparent cathode layer and a reflective anode structure. The anode of the pixels may include both the reflective anode structure and a transparent anode structure that is used to tune the thickness of the optical cavity for each pixel. Organic light-emitting diode layers may be formed over the pixels and may have a uniform thickness in each pixel in the display. The reflective anode structure may be formed from a silver alloy having a high reflectance. The transparent anode structure may be electrically connected to the reflective anode structure using a via or may be formed in direct contact with the reflective anode structure. The reflective anode structures may be formed using chemical mechanical polishing of a silver alloy.

17 Claims, 8 Drawing Sheets

14

(51) Int. Cl.

| | |
|---|---|
| *H10K 59/122* | (2023.01) |
| *H10K 59/35* | (2023.01) |
| *H10K 71/00* | (2023.01) |

(52) U.S. Cl.
CPC . *H10K 59/80518* (2023.02); *H10K 59/80524* (2023.02); *H10K 71/00* (2023.02); *H10K 59/35* (2023.02)

(56) References Cited

U.S. PATENT DOCUMENTS

| | | | |
|---|---|---|---|
| 7,023,013 B2 | 4/2006 | Ricks et al. | |
| 7,645,478 B2 | 1/2010 | Thelss et al. | |
| 8,847,215 B2 | 9/2014 | Park et al. | |
| 9,065,079 B2 | 6/2015 | Liu et al. | |
| 9,337,249 B2 | 5/2016 | Wang et al. | |
| 10,381,381 B1 | 8/2019 | Choi et al. | |
| 2005/0280008 A1* | 12/2005 | Ricks | H10K 59/876 |
| | | | 257/79 |
| 2010/0309572 A1* | 12/2010 | Mignard | G02B 26/0825 |
| | | | 427/532 |
| 2011/0127673 A1* | 6/2011 | Anderson | H01L 21/76834 |
| | | | 438/653 |
| 2014/0131688 A1 | 5/2014 | Okuno et al. | |
| 2014/0326983 A1 | 11/2014 | Yamazaki et al. | |
| 2015/0228932 A1 | 8/2015 | Ma et al. | |
| 2015/0357592 A1 | 12/2015 | Li et al. | |
| 2017/0047550 A1 | 2/2017 | Lee | |
| 2019/0198816 A1* | 6/2019 | Park | G02B 5/284 |
| 2019/0296264 A1 | 9/2019 | Mathai et al. | |
| 2020/0035754 A1 | 1/2020 | Li et al. | |
| 2020/0035951 A1 | 1/2020 | Cheon et al. | |
| 2020/0144548 A1* | 5/2020 | Xia | H10K 50/852 |
| 2020/0295104 A1* | 9/2020 | Kim | H10K 59/38 |
| 2020/0303683 A1* | 9/2020 | Sano | H10K 59/126 |
| 2021/0057670 A1 | 2/2021 | Wong et al. | |
| 2021/0118959 A1* | 4/2021 | Sano | H10K 59/876 |

FOREIGN PATENT DOCUMENTS

| | | | | |
|---|---|---|---|---|
| CN | 112002824 A | * | 11/2020 | H10K 50/81 |
| KR | 20070058765 A | | 6/2007 | |
| KR | 20180078641 A | | 7/2018 | |
| KR | 20190065735 A | | 6/2019 | |

* cited by examiner

ORGANIC LIGHT-EMITTING DIODE DISPLAY WITH OPTICAL CAVITIES AND SILVER ANODES

This application claims priority to U.S. provisional patent application No. 63/243,637, filed Sep. 13, 2021, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and transistors for controlling application of a signal to the light-emitting diode to produce light. The light-emitting diodes may include OLED layers positioned between an anode and a cathode. To emit light from a given pixel in an organic light-emitting diode display, a voltage may be applied to the anode and the cathode of the given pixel.

Some OLED pixels may include microcavity OLED pixels, where OLED layers are covered by a partially transparent layer to form an optical cavity. The thickness of the optical cavity may be tuned so that light of a selected wavelength is emitted with high efficiency. However, if care is not taken, OLED pixels of this type may have non-uniform thicknesses, may have smaller than desired aperture ratios, may have lower than desired efficiency, and/or may require complex manufacturing processes.

It is within this context that the embodiments herein arise.

SUMMARY

An electronic device may have a display such as an organic light-emitting diode display. The organic light-emitting diode (OLED) display may have an array of organic light-emitting diode pixels that each have OLED layers interposed between a cathode and an anode.

The pixels in the OLED display may be microcavity OLED pixels having optical cavities. The optical cavities may be defined by a partially transparent cathode layer and a reflective anode structure. The anodes of the pixels may include a supplemental anode that is transparent and that is used to tune the thickness of the optical cavity for each pixel.

White organic light-emitting diode layers may be formed over the pixels and may have a uniform thickness in each pixel in the display. The thickness of the optical cavity of each pixel is controlled using the thickness of the transparent anode stack that includes the supplemental anode and, optionally, additional dielectric spacer layers. Blue pixels, green pixels, and red pixels may have increasingly thick optical cavities.

The reflective anode structures may be formed from a silver alloy to maximize efficiency. The transparent anode structure may be electrically connected to the reflective anode structure using a via through a dielectric spacer. Alternatively, the transparent anode structure may be formed in direct contact with the reflective anode structure. In this case, the thickness of the transparent anode structures may be varied to control the thickness of the optical cavity.

To form reflective anode structures formed from silver alloy, silver alloy may be formed in trenches in a dielectric layer. A barrier metal may be interposed between the silver alloy and the dielectric layer. Chemical mechanical polishing of the silver alloy may be performed to remove excess silver alloy.

DETAILED DESCRIPTION

Figure 1:
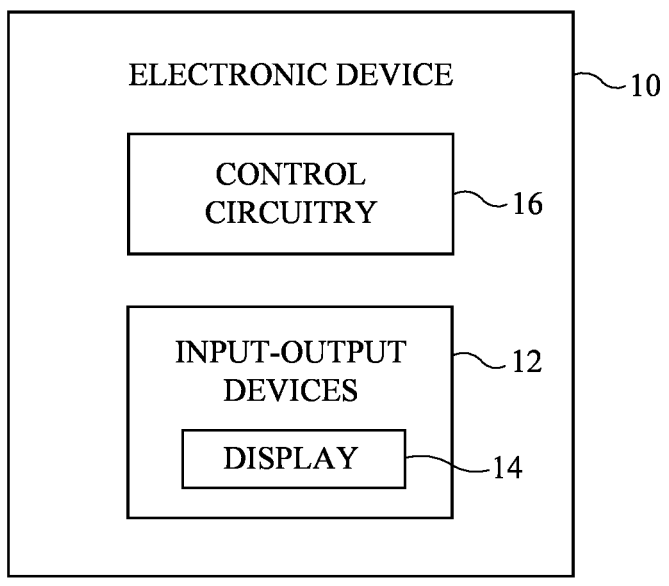
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
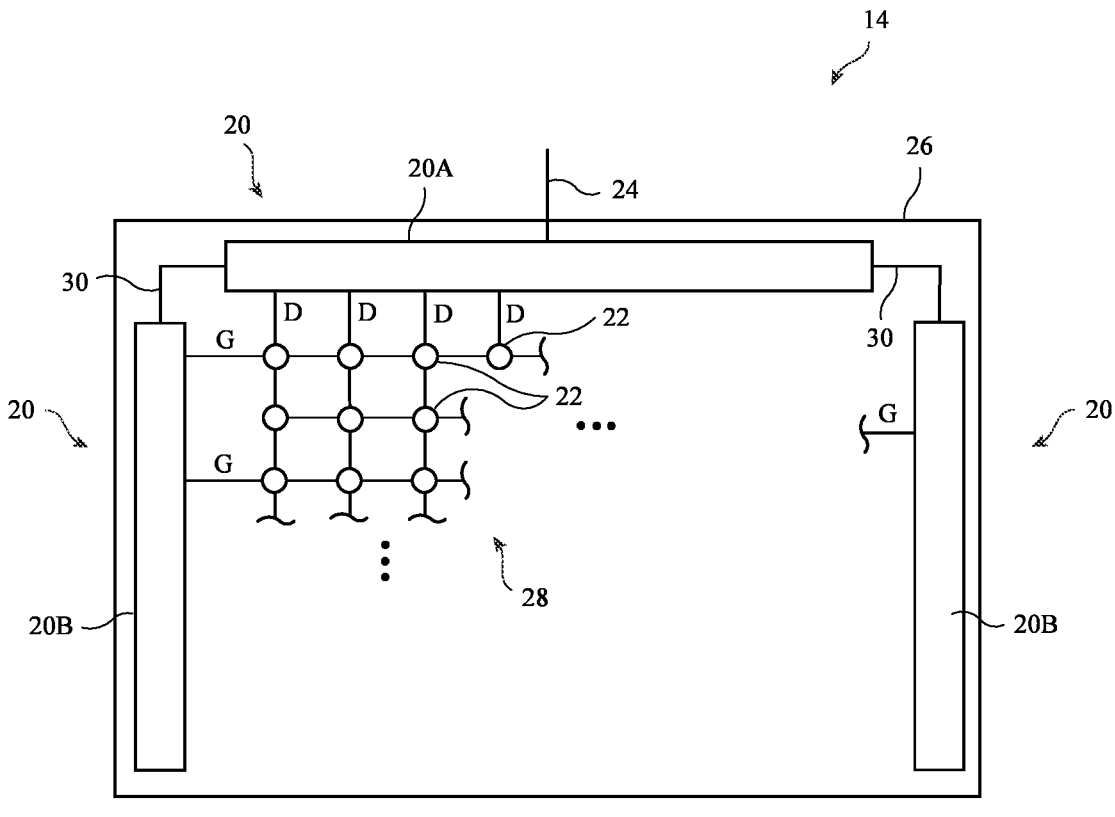
FIG. 2 is a schematic diagram of an illustrative display in accordance with an embodiment.

FIG. 2 is a diagram of an illustrative display 14. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. Pixels of other colors such as cyan, magenta, and yellow might also be used.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally across display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
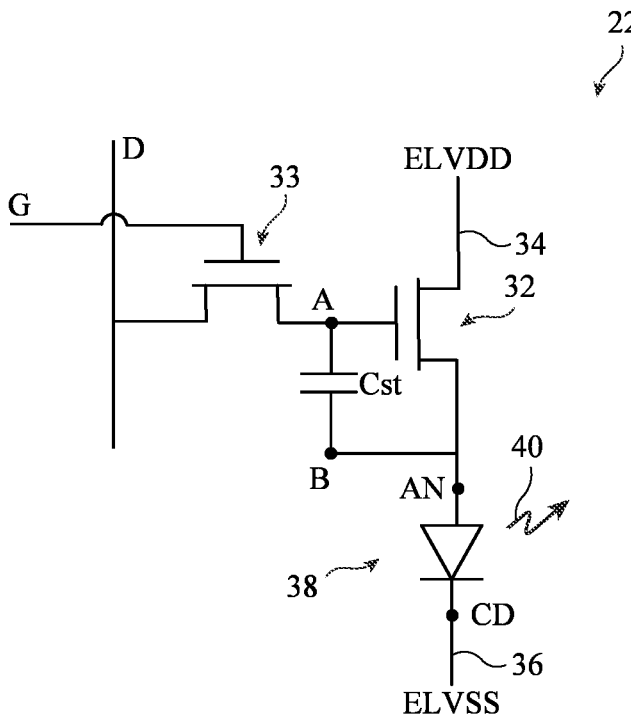
FIG. 3 is a diagram of an illustrative display pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel may include additional switching transistors, emission transistors in series with the drive transistor, etc. Capacitor Cst may be positioned at other desired locations within the pixel (e.g., between the source and gate of the drive transistor). The display pixel circuit of FIG. 3 is merely illustrative.

Figure 4:
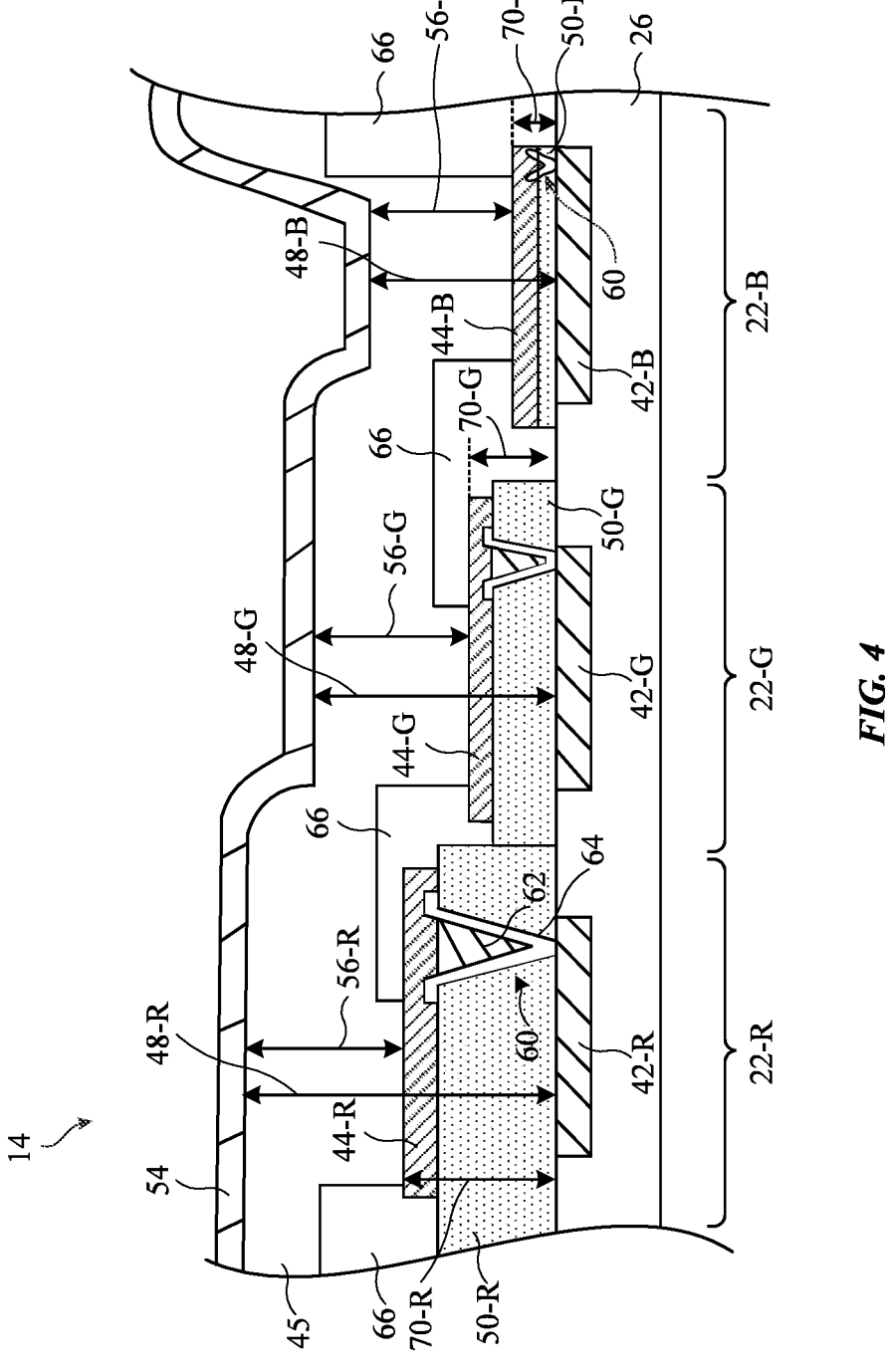
FIG. 4 is a cross-sectional side view of an illustrative display having microcavity organic light-emitting diode pixels with vias and silver alloy anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Substrate 26 may include transistor circuitry for applying control signals to the pixels. The transistor circuitry may include bulk transistors (where transistors are formed on the surface of a semiconductor substrate such as a silicon substrate). Another option is for the transistor circuitry to include thin-film transistors (TFTs), where a thin semiconductor film layer (e.g., formed from poly-crystalline or amorphous silicon) is formed on an insulating substrate (e.g., a glass or plastic substrate). In general, the OLED pixels described herein may include any desired combination of thin-film transistors and bulk transistors. FIG. 4 shows a red pixel 22-R, a blue pixel 22-B, and a green pixel 22-G.

Anodes 42 such as anodes 42-R, 42-G, and 42-B may be formed on substrate 26. Anodes 42-R, 42-G, and 42-B may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an electron-block layer (EBL), an emissive layer (EML), an electron-transport layer (ETL), an electronic-injection layer (EIL), and a charge generation layer (CGL).

OLED layers 45 may form a plurality of single diodes or a plurality of tandem diodes. OLED layers 45 may be formed from white OLED layers (e.g., OLED layers configured to emit white light), combinations of red, green, blue, and/or yellow OLED layers, etc. Cathode 54 may be a conductive layer formed on the OLED layers 45. Cathode layer 54 may form a common cathode terminal (see, e.g., cathode terminal CD of FIG. 3) for all diodes in display 14. Each anode in display 14 may be independently controlled, so that each diode in display 14 can be independently controlled. This allows each pixel 22 to produce an independently controlled amount of light.

In some OLED displays, cathode 54 is entirely (or almost entirely) transparent and anodes 42 may be in direct contact with OLED layers 45. The display of FIG. 4, however, uses an optical cavity to enhance efficiency and color purity in the display. Using optical cavities as in FIG. 4 allows for uniform white OLED layers 45 to provide red, green, and blue light from red pixel 22-R, green pixel 22-G, and blue pixel 22-B respectively. An optical cavity may be formed by reflective layers within the display that are formed on either side of the OLED layers. By tuning the thickness of the optical cavity that includes the OLED layers, each pixel may be optimized to have high emission at a desired wavelength. To form an optical cavity of this type, display 14 in FIG. 4 includes a partially transparent cathode layer 54 and additional anode portions 44.

Cathode layer 54 may be formed from a partially transparent conductive material. In one illustrative example, cathode layer 54 may be formed from a combination of magnesium (Mg) and silver (Ag). Cathode layer 54 may be formed form any other desired conductive material or combination of conductive materials. Cathode 54 may transmit less than 90% of light, may transmit less than 80% of light, may transmit less than 70% of light, may transmit less than 60% of light, may transmit less than 50% of light, may transmit more than 40% of light, may transmit more than 50% of light, may transmit more than 60% of light, may transmit between 40% and 80% of light, may transmit between 45% and 60% of light, may transmit between 60% and 70% of light, may transmit between 50% and 75% of light, etc. Cathode 54 may reflect more than 10% of light, may reflect more than 20% of light, may reflect more than 30% of light, may reflect more than 40% of light, may reflect more than 50% of light, may reflect more than 60% of light, may reflect less than 50% of light, may reflect less than 60% of light, may reflect between 20% and 60% of light, may reflect between 40% and 55% of light, may reflect between 30% and 40% of light, may reflect between 25% and 50% of light, etc.

Cathode layer 54 may define a first boundary for the optical cavity. The other boundary of the optical cavity may be set by anode 42 (sometimes referred to as anode portion 42, reflective anode portion 42, reflective anode structure 42, etc.). Anodes 42-R, 42-G, and 42-B may be formed from a highly reflective material such as an aluminum copper (AlCu) alloy, a silver alloy (a combination of silver and at least one other material such as copper, germanium, palladium, etc.), or any other desired conductive material. Each anode 42 may reflect more than 70% of light (e.g., visible light), more than 80% of light, more than 90% of light, more than 95% of light, more than 99% of light, etc.

Additional layers may be formed over anodes 42 between the anodes and OLED layers 45. However, these additional layers may be transparent and therefore do not disrupt the optical cavity. Because the additional layers are transparent, the boundaries of the optical cavity are still determined by the reflective anode 42 and cathode 54. The presence of the additional transparent layers between anode 42 and cathode 54 may result in an increased distance between the reflective anode 42 and cathode 54 (because the OLED thickness is uniform). FIG. 4 shows how pixel 22-R has an optical cavity with thickness 48-R between anode 42-R and cathode 54. Pixel 22-G has an optical cavity with thickness 48-G between anode 42-G and cathode 54. Pixel 22-B has an optical cavity with thickness 48-B between anode 42-B and cathode 54.

Each optical cavity thickness is tuned to optimize emission of the desired color of light for that pixel. For a given optical cavity thickness, light of a given wavelength will resonate due to multiple reflections off of the walls (e.g., cathode 54 and anode 42) of the optical cavity. The increased emission at the given wavelength caused by resonance within the optical cavity may be referred to as a microcavity effect. Pixels that are optimized to induce this effect (such as the pixels in FIG. 4) may be referred to as microcavity OLED pixels.

Pixel 22-R has an optical cavity thickness 48-R that maximizes emission of red light. Pixel 22-G has an optical cavity thickness 48-G that maximizes emission of green light. Pixel 22-B has an optical cavity thickness 48-B that maximizes emission of blue light. Blue light has a shorter wavelength than green light, which has a shorter wavelength than red light. Generally, the thickness of the optical cavity may be proportional to the wavelength of the type of light that is intended to be emitted. Therefore, thickness 48-B is less than thickness 48-G and thickness 48-G is less than thickness 48-R. This example is merely illustrative and does not necessarily hold true for all display designs, as other factors such as the node of the cavity may influence the optical cavity.

The thickness of each optical cavity is therefore tuned to optimize emission of light. However, changing the thickness of each optical cavity may present difficulties during manufacturing. To reduce complexity and cost in manufacturing microcavity OLED displays, additional anode portions 44 may be included in each pixel. As shown in FIG. 4, red pixel 22-R has an additional anode portion 44-R, green pixel 22-G has an additional anode portion 44-G, and blue pixel 22-B has an additional anode portion 44-B. These additional anode portions 44 (sometimes referred to as supplementary anodes 44, anodes 44, transparent anodes 44, transparent anode structures 44, etc.) may be formed from a transparent conductive material. The additional anode portions may be formed from a transparent conductive oxide such as indium tin oxide (ITO), indium zinc oxide (IZO), or any other desired transparent conductive material. Because the additional anodes are transparent, they may be used to tune the optical cavity thickness 48 of the pixels without disrupting the optical cavity between reflective anode 42 and cathode 54.

A pixel definition layer 66 may be formed between each pixel. The pixel definition layer may be formed from a non-conducting material and may be interposed between adjacent anodes of the display. The pixel definition layer may be formed from a non-conductive material (that is either opaque or transparent) and may have openings in which the anodes are formed, thereby defining the area of each pixel.

One or more additional layers may be included between anode portion 44 and anode portion 42 in each pixel. As shown in FIG. 4, dielectric spacers 50 (sometimes referred to as spacers, dielectric layers, etc.) are included in display 14. A first dielectric spacer 50-R is formed over anode 42-R in red pixel 22-R. A second dielectric spacer 50-G is formed over anode 42-G in green pixel 22-G. A third dielectric spacer 50-B is formed over anode 42-B in blue pixel 22-B. It should be noted that multiple dielectric layers may be used to make up each one of dielectric spacers 50. In some cases, a single dielectric layer may be shared between multiple dielectric spacers. For example, a first dielectric layer may form a portion of spacer 50-R and the entirety of spacer 50-G. In this case, spacer 50-R may include a second dielectric layer to increase the thickness of the overall spacer 50-R relative to spacer 50-G.

Dielectric spacers 50 as well as supplemental anodes 44 may all be transparent or substantially transparent. This allows the layers to serve as spacers that can have thicknesses chosen to tune the thickness of the optical cavity for each pixel. Dielectric spacers 50 as well as supplemental anodes 44 may transmit more than 90% of incident light, more than 95% of incident light, more than 99% of incident light, more than 99.9% of incident light, etc. Dielectric spacers 50 may be formed from one or more layers of silicon dioxide, silicon oxynitride, another desired oxide material, silicon nitride, or any other desired transparent material.

Dielectric spacers 50 serve as spacer structures that allow tuning of cavity thickness 48 for each pixel. For ease of manufacturing, it is desirable for a uniform thickness white OLED layer 45 to be formed over each supplemental anode 44. This way, OLED layers 45 may be formed in a single deposition step instead of being patterned to have different thicknesses and/or different color OLED material for each pixel. As shown in FIG. 4, the OLED thickness 56-R of pixel 22-R, the OLED thickness 56-G of pixel 22-G, and the OLED thickness 56-B of pixel 22-B are approximately (e.g., within 5% of) the same.

Without dielectric spacers 50 and supplemental anodes 44, having a uniform thickness OLED layer would result in the optical cavity thickness of each pixel being the same. Including dielectric spacers and supplemental anodes as in FIG. 4 allows for the optical cavity thickness to be tuned for a desired color.

Supplemental anodes 44 may be electrically connected to anodes 42. As shown in FIG. 4, a via 60 may be formed that extends through dielectric spacer 50-R to electrically connect anode portion 44-R to anode portion 42-R. In FIG. 4, via 60 includes a conductive portion 62 and a conductive liner 64. Another via having the same structure (e.g., with a conductive portion and a conductive liner) is also formed through dielectric spacer 50-G to electrically connect supplemental anode 44-G to anode 42-G. Another via having the same structure (e.g., with a conductive portion and a conductive liner) is also formed through dielectric spacer 50-B to electrically connect supplemental anode 44-B to anode 42-B.

Each layer in display 14 may have any desired thickness. In some arrangements, supplemental anode portions 44-R, 44-G, and 44-B may have the same thickness (e.g., within 5%, within 3%, within 1%, etc.). Each supplemental anode portion may have a thickness of less than 100 nanometers, less than 50 nanometers, less than 30 nanometers, less than 20 nanometers, less than 15 nanometers, less than 10 nanometers, greater than 5 nanometers, between 5 and 50 nanometers, between 5 and 100 nanometers, etc. Similarly, each one of dielectric spacers 50 may have any desired thickness (e.g., less than 100 nanometers, less than 50 nanometers, less than 30 nanometers, less than 20 nanometers, less than 15 nanometers, less than 10 nanometers, greater than 5 nanometers, between 5 and 50 nanometers, between 5 and 100 nanometers, etc.).

The supplemental anode and underlying layers between the supplemental anode and anode may be referred to as an anode stack. For example, pixel 22-R has an anode stack that includes supplemental anode 44-R and dielectric spacer 50-R. The total thickness 70-R of the anode stack is tuned to determine the total optical cavity thickness 48-R. Pixel 22-G has an anode stack that includes supplemental anode 44-G and dielectric spacer 50-G. The total thickness 70-G of the anode stack is tuned to determine the total optical cavity thickness 48-G. Pixel 22-B has an anode stack that includes supplemental anode 44-B and dielectric spacer 50-B. The total thickness 70-B of the anode stack is tuned to determine the total optical cavity thickness 48-B. In one arrangement, the thickness 70-R of the anode stack of red pixel 22-R may be between 100 and 200 nanometers, the thickness 70-G of the anode stack of green pixel 22-G may be between 70 and 100 nanometers, and the thickness 70-B of the anode stack of blue pixel 22-B may be between 10 and 30 nanometers. These thickness values are merely illustrative. Each anode stack may have any desired thickness (e.g., greater than 200 nanometers, between 100 nanometers and 150 nanometers, between 50 and 125 nanometers, less than 100 nanometers, less than 50 nanometers, less than 25 nanometers, less than 20 nanometers, etc.).

The example of FIG. 4 in which white OLED layers 45 are uniformly deposited for pixels 22-R, 22-G, and 22-B is merely illustrative. In some designs, each pixel may have corresponding OLED layers of that color. For example, red pixel 22-R may have red OLED layers (e.g., OLED layers that emit red light), green pixel 22-G may have green OLED layers (e.g., OLED layers that emit green light), and blue pixel 22-B may have blue OLED layers (e.g., OLED layers that emit blue light). This type of arrangement may offer efficiency improvements at the cost of increased manufacturing complexity.

Conductive portion 62 of each via 60 may optionally be formed from the same material as supplemental anode portions 44. For example, if supplemental anode 44-R for pixel 22-R is formed from indium tin oxide, conductive portion 62 of via 60 in pixel 22-R may also be formed from indium tin oxide. In some cases, conductive liner 64 may be included in the via 60 to prevent corrosion (caused by interaction between conduction portion 62 and anode 42). Alternatively, if the via material is compatible with the anode material(s), conductive liner 64 may be omitted from the via and the via may include a single conductive material that is in direct contact with transparent anode structure 44 and reflective anode structure 42. Via 60 may include conductive materials such as titanium nitride, indium tin oxide, a combination of titanium nitride and indium tin oxide, etc.

Figure 5:
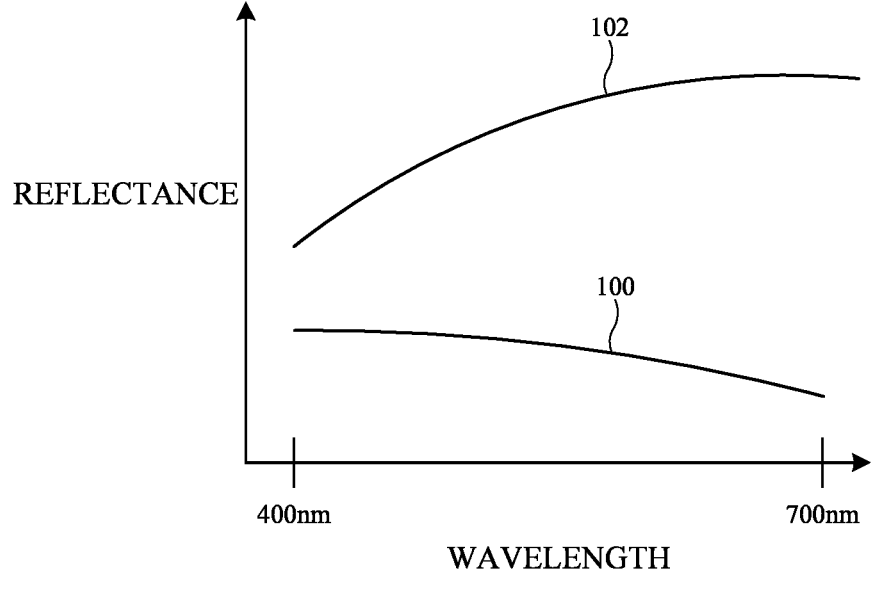
FIG. 5 is a graph of reflectance as a function of wavelength for various anode materials in accordance with an embodiment.

In some cases, anodes 42 may be formed from an aluminum alloy such as aluminum copper (AlCu). However, a silver alloy may instead be used as the material for anodes 42. The silver alloy may have an increased reflectance relative to the aluminum copper. FIG. 5 is a graph of reflectance of the anodes as a function of wavelength. Profile 100 shows the reflectance of an aluminum copper anode across the visible light spectrum. As shown, the reflectance of aluminum copper may gradually decrease between 400 nanometers and 700 nanometers. At 400 nanometers, the reflectance of the aluminum copper anode may be approximately 93%. At 700 nanometers, the reflectance of the aluminum copper anode may be approximately 90%. Profile 102 shows the reflectance of a silver alloy anode across the visible light spectrum. As shown, the reflectance of the silver alloy is greater than the reflectance of aluminum copper between 400 nanometers and 700 nanometers. At 400 nanometers, the reflectance of the silver alloy anode may be approximately 95%. At 700 nanometers, the reflectance of the aluminum copper anode may be approximately 99%. In other words, the anodes formed from silver alloy may have a reflectance above 94% between 400 nanometers and 700 nanometers. Therefore, using a silver alloy for the anodes of FIG. 4 results in an increased reflectance of the anodes and, accordingly, an increased efficiency for the display.

In FIG. 4, each pixel includes a dielectric spacer between a respective reflective anode structure and transparent anode structure. This example is merely illustrative. In another possible arrangement, shown in FIG. 6, dielectric spacers 50 may be omitted and transparent anode structures 44 may be formed in direct contact with reflective anode structures 42.

Figure 6:
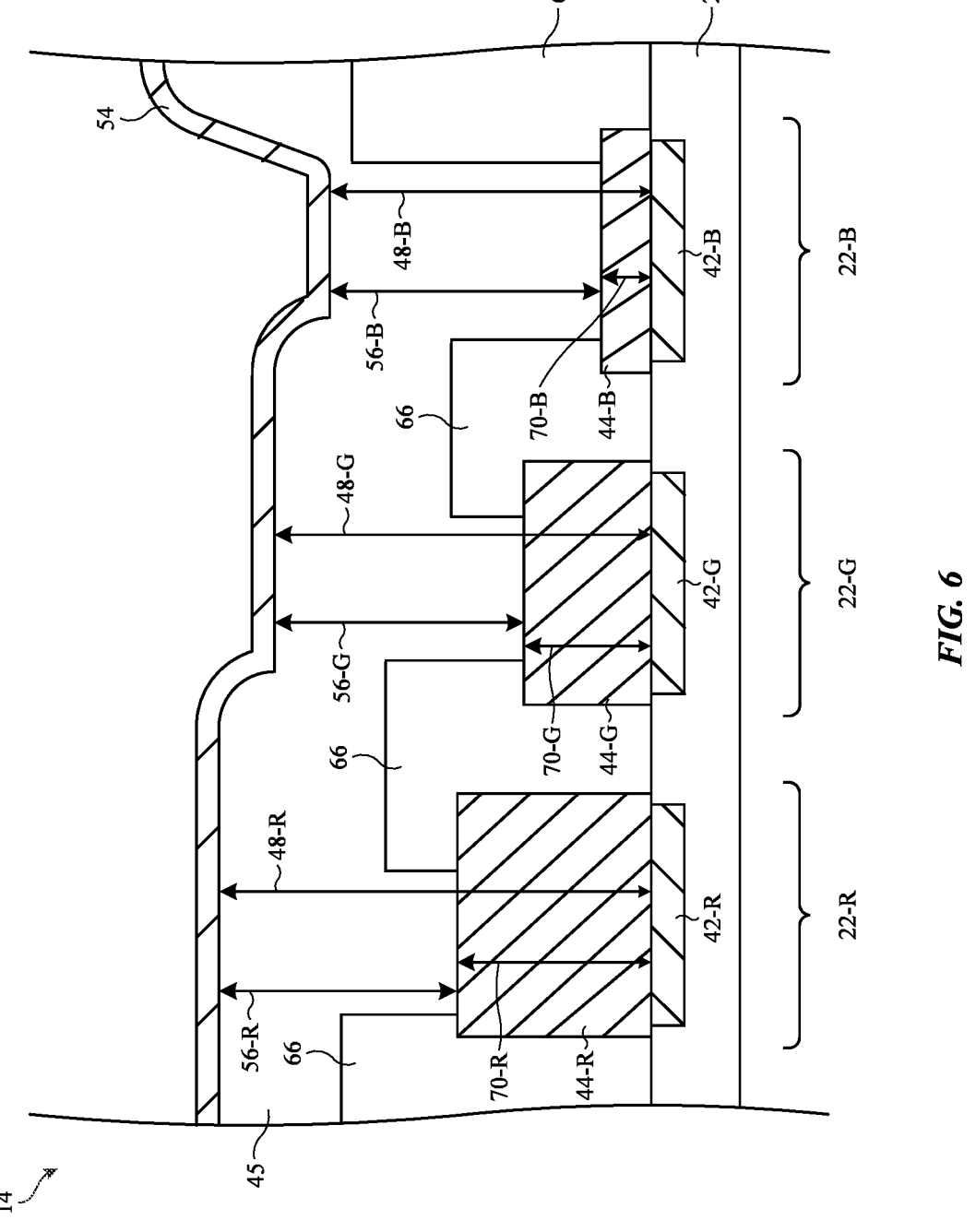
FIG. 6 is a cross-sectional side view of an illustrative display having microcavity organic light-emitting diode pixels with silver alloy anodes and without vias in accordance with an embodiment.

As shown in FIG. 6, supplemental anode portion 44-R is formed directly over and in direct contact with anode portion 42-R without an intervening layer. Similarly, supplemental anode portion 44-G is formed directly over and in direct contact with anode portion 42-G without an intervening layer and supplemental anode portion 44-B is formed directly over and in direct contact with anode portion 42-B without an intervening layer.

Having supplemental anode portions 44 formed directly over and in direct contact with anode portions 42 (as in FIG. 6) without an intervening dielectric layer allows for vias 60 (e.g., vias through a dielectric spacer as in the pixels of FIG. 4) to be omitted from the pixels in FIG. 6. Omitting the vias allows for the aperture ratio of the pixels to be increased. A pixel's aperture is the area from which light is emitted from the pixel. In the display shown in FIG. 6, each pixel's aperture is defined by pixel definition layers 66 (e.g., the aperture corresponds to areas not covered by the pixel definition layer). Aperture ratio refers to the ratio of a pixel's aperture (e.g., light-emitting area) to the pixel's total area (e.g., the sum of the light-emitting area and the non-light-emitting area). In general, having a larger aperture ratio is desirable as larger aperture ratios correspond to higher display efficiency and improved display performance.

As shown in FIG. 4, vias 60 are non-light-emitting areas that are therefore covered by pixel definition layer 66. The presence of via 60 reduces the aperture ratio of the pixel. Omitting via 60 in the pixels of FIG. 6 therefore improves the aperture ratio of the pixels 22.

In FIG. 6, anodes 42 are formed from a reflective silver alloy and supplemental anodes 44 are formed from a transparent conductive oxide such as indium tin oxide (ITO). The silver alloy of anodes 42 is compatible with the indium tin oxide of supplemental anodes 44. Therefore, supplemental anodes 44 may be formed in direct contact with anodes 42 (with minimal risk of oxidation, galvanic corrosion, or other material incompatibilities).

In FIG. 6, the thicknesses of the supplemental anodes vary. For example, supplemental anode 44-R may have a different (e.g., larger) thickness than supplemental anode 44-G and supplemental anode 44-B. Supplemental anode 44-G may have a different (e.g., larger) thickness than supplemental anode 44-B. Using supplemental anodes 44 of varying thicknesses allows for the total optical cavity thickness 48 to be optimized for each pixel type (e.g., pixel 22-R has an optical cavity thickness 48-R that maximizes emission of red light, pixel 22-G has a smaller optical cavity thickness 48-G that maximizes emission of green light, and pixel 22-B has an even smaller optical cavity thickness 48-B that maximizes emission of blue light) while allowing OLED thicknesses 56-R, 56-G, and 56-B to remain approximately the same.

An arrangement of the type shown in FIG. 6 has the benefit of omitting deposition steps for the intervening dielectric layers of FIG. 4. Additionally, no conductive via is required through the intervening dielectric layers, allowing for the pixel aperture ratio to be increased relative to when a via is required. A via-less pixel design (e.g., as in all three pixels in FIG. 6 where no intervening dielectric layers are present) may be used for all three pixel color types (as in FIG. 6), one pixel color type, or any two pixel color types.

In FIGS. 4 and 6, examples are shown where continuous OLED layers 45 are formed across the display. This example is merely illustrative. It should be understood that pixel definition layers 66 and/or other structures may be used to form discontinuities in one or more of the OLED layers if desired. Forming discontinuities in the OLED layers may prevent light leakage between pixels.

The center-to-center spacing between anodes in the display may be less than 20 microns, less than 15 microns, less than 10 microns, less than 5 microns, less than 3 microns, between 2 microns and 10 microns, etc.

Figure 7:
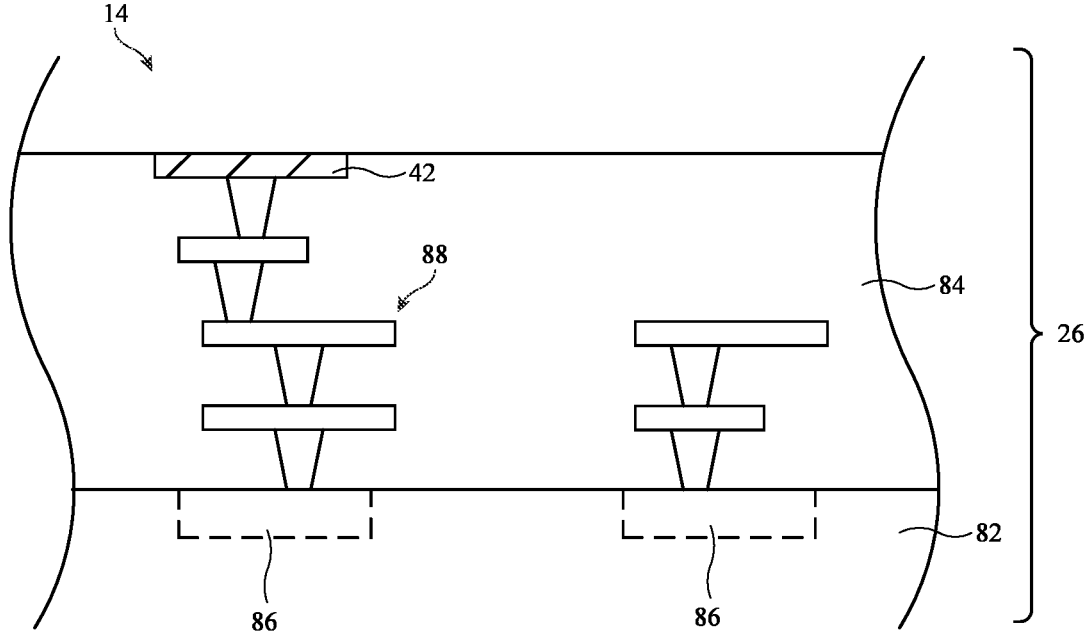
FIG. 7 is a cross-sectional side view of an illustrative display showing how the anodes may be formed in trenches in a dielectric layer that is formed over a silicon layer and includes metal interconnect layers in accordance with an embodiment.

FIG. 7 is a cross-sectional side view of display 14 showing how silver alloy anodes 42 may be formed on a substrate 26 that includes bulk transistors fabricated on a silicon wafer and associated dielectric layers and metal interconnect layers. As shown in FIG. 7, substrate 26 includes a silicon layer 82 (sometimes referred to as silicon wafer 82, wafer 82, semiconductor substrate 82, semiconductor layer 82, etc.). The semiconductor wafer includes a plurality of transistors 86 (e.g., that may implement transistors that operate each display pixel). The transistors 86 may be fabricated on silicon wafer 82 using a complementary metal-oxide-semiconductor (CMOS) manufacturing process.

One or more dielectric layers 84 may be formed over silicon wafer 82. Metal interconnect routing layers 88 (sometimes referred to as metal interconnect layers 88, metal routing layers 88, etc.) are formed in the dielectric layers 84. The metal interconnect routing layers 88 may electrically connect anode 42 to a respective transistor 86 in wafer 82.

Figure 8:
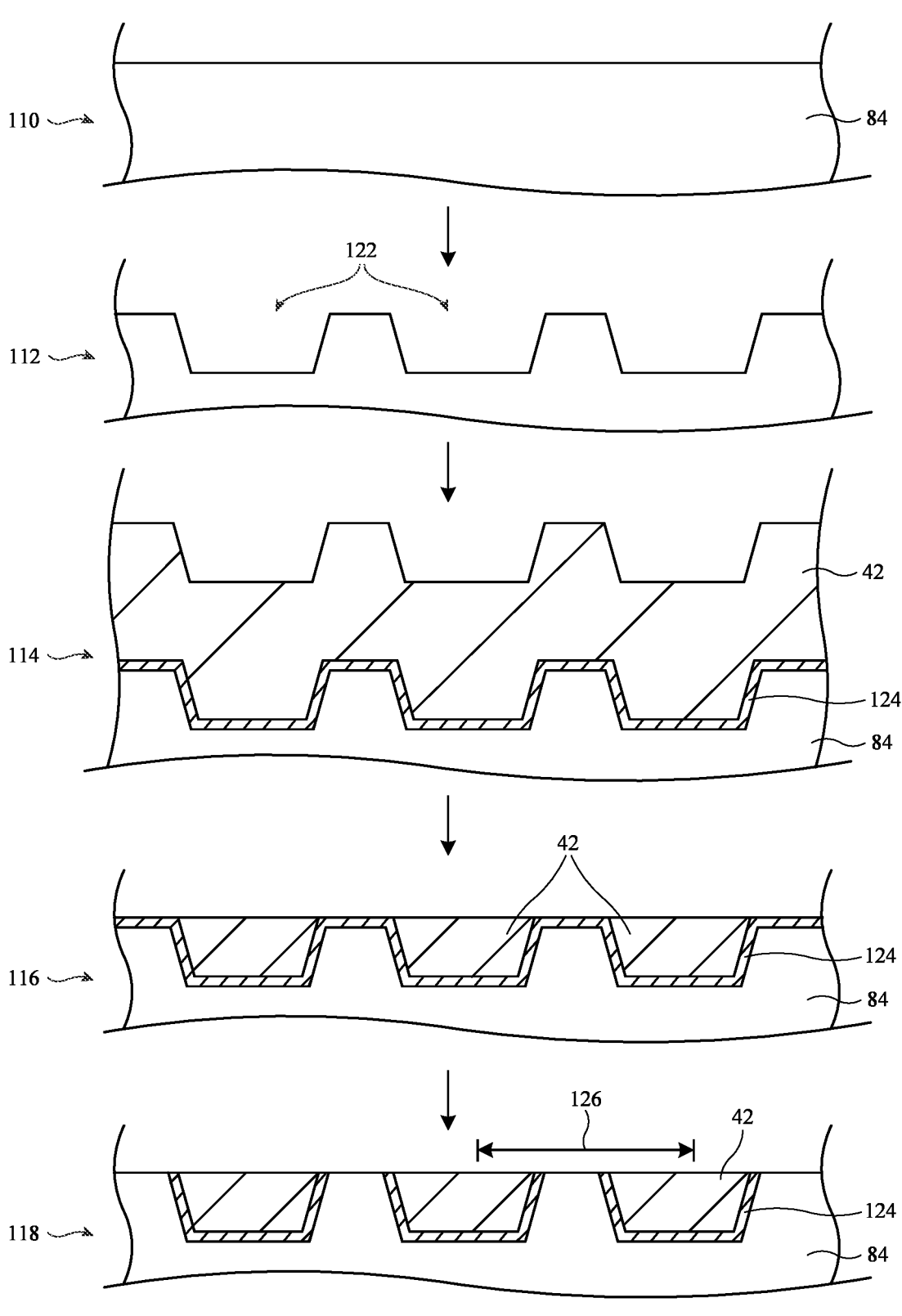
FIG. 8 is a cross-sectional side view showing illustrative method steps for forming silver alloy anodes with small center-to-center spacing in accordance with an embodiment.

Anode 42 (e.g., the anodes of FIG. 4 or FIG. 6) are formed in the dielectric layer 84 that also includes the metal interconnect routing layers 88. FIG. 8 is schematic diagram showing how anodes 42 may be formed in dielectric layer 84.

As shown in FIG. 8, at step 110, a dielectric layer 84 is formed (e.g., over silicon wafer 82 as in FIG. 7). Dielectric layer 84 may be formed from an oxide material (e.g., silicon dioxide) or any other desired material. At step 112, dielectric layer 84 is etched to form trenches 122. The dielectric layer may be etched using photolithography or any other desired techniques. Next, at step 114, a barrier metal layer 124 and anode metal 42 are deposited across dielectric layer 84. Barrier metal layer 124 may serve as a diffusion barrier between anode metal 42 and dielectric layer 84. Additionally, barrier metal layer 124 may help adhere the anode metal 42 to dielectric layer 84. Barrier metal layer 124 may be deposited with an approximately uniform thickness across the dielectric layer. Each one of barrier metal layer 124 and anode metal 42 may be deposited using sputtering or any other desired process. The anode metal 42 may be deposited with an approximately uniform thickness across the dielectric layer. The anode metal may be a silver alloy, as previously discussed. The portions of anode metal 42 in trenches 122 form reflective anode structures for the display.

Next, at step 116, chemical mechanical polishing (CMP) of the silver alloy may be performed. This removes the excess silver alloy (e.g., between the trenches) to form a planarized layer over the dielectric layer. After step 116, no silver alloy may be present between the trenches 122. At step 118, chemical mechanical polishing (CMP) of the barrier metal may be performed. This process may remove the barrier metal that is present between adjacent trenches/anodes. A cleaning process may be performed after the barrier metal CMP step to further planarize the upper surface. After step 118, dielectric layer 84 may have an upper surface with trenches that are filled with barrier metal 124 and anode metal 42. The dielectric layer 84, barrier metal 124, and anode metal 42 may all have portions that form part of a coplanar surface (e.g., at the upper surface of dielectric layer 84).

Using the silver alloy CMP step of FIG. 8 may enable very small pixels to be formed. The pixels may therefore be tightly spaced, improving the performance of the display. The center-to-center spacing 126 between anodes in the display may be less than 20 microns, less than 15 microns, less than 10 microns, less than 5 microns, less than 4 microns, less than 3 microns, between 3 microns and 4 microns, between 2 microns and 5 microns, between 2 microns and 10 microns, etc.

The anodes 42 of FIG. 4 or FIG. 6 may be formed using the techniques of FIGS. 7 and 8. The anodes 42 of FIGS. 4 and 6 may have the barrier metal of FIG. 8 between the anode metal and an underlying dielectric substrate and the spacing described in connection with FIG. 8.

The foregoing is merely illustrative and various modifications can be made by those skilled in the art without departing from the scope and spirit of the described embodiments. The foregoing embodiments may be implemented individually or in any combination.

What is claimed is:

1. A display comprising a plurality of pixels, wherein each pixel of the plurality of pixels comprises:
    a reflective anode structure that comprises silver;
    a layer formed over the reflective anode structure;
    a transparent anode structure that overlaps and is formed over the layer;
    a via that extends through the layer and electrically connects the reflective anode structure and the transparent anode structure, wherein the via is interposed between the reflective anode structure and the transparent anode structure along an axis parallel to a surface normal of the display, wherein the via comprises a liner and a conductive portion, and wherein the liner is interposed between the conductive portion and the layer;
    organic light-emitting diode layers that are formed over the transparent anode structure; and
    a cathode that is formed over the organic light-emitting diode layers, wherein a distance between the reflective anode structure and the cathode defines an optical cavity.

2. The display defined in claim 1, wherein the reflective anode structure is formed from a silver alloy that includes the silver.

3. The display defined in claim 1, wherein the transparent anode structure is formed from a transparent conductive oxide material.

4. The display defined in claim 1, wherein the transparent anode structure is formed from indium tin oxide.

5. The display defined in claim 1, wherein a center-to-center spacing between each pair of adjacent reflective anode structures is less than 10 microns.

6. The display defined in claim 1, wherein the liner is conductive.

7. The display defined in claim 1, wherein the reflective anode structure has a reflectance above 94% for light between 400 nanometers and 700 nanometers.

8. The display defined in claim 1, wherein the plurality of pixels includes red pixels, green pixels, and blue pixels, wherein the distance between the reflective anode structure and the cathode for the red pixels has a first magnitude, wherein the distance between the reflective anode structure and the cathode for the green pixels has a second magnitude, wherein the distance between the reflective anode structure and the cathode for the blue pixels has a third magnitude, wherein the first magnitude is greater than the second magnitude, and wherein the second magnitude is greater than the third magnitude.

9. The display defined in claim 1, wherein the plurality of pixels includes red pixels, green pixels, and blue pixels, wherein a thickness of the layer for the red pixels has a first magnitude, wherein a thickness of the layer for the green pixels has a second magnitude, wherein a thickness of the layer for the blue pixels has a third magnitude, wherein the first magnitude is greater than the second magnitude, and wherein the second magnitude is greater than the third magnitude.

10. The display defined in claim 1, wherein the reflective anode structures for the plurality of pixels are formed in a dielectric layer, wherein the dielectric layer is formed over a silicon layer that includes transistors, and wherein each one of the reflective anode structures is electrically connected to one of the transistors in the silicon layer.

11. A display comprising a plurality of pixels, wherein each pixel of the plurality of pixels comprises:
  a reflective anode structure that comprises silver;
  a dielectric spacer formed over the reflective anode structure;
  a transparent anode structure, wherein the dielectric spacer is interposed between the reflective anode structure and the transparent anode structure, wherein the transparent anode structure is electrically connected to the reflective anode structure through the dielectric spacer using a via, wherein the via comprises a conductive portion and a conductive liner, wherein the conductive portion electrically connects the transparent anode structure to the reflective anode structure, and wherein the conductive liner is interposed between the conductive portion and the dielectric spacer;

organic light-emitting diode layers that are formed over the transparent anode structure; and
  a cathode that is formed over the organic light-emitting diode layers, wherein a distance between the reflective anode structure and the cathode defines an optical cavity.

12. The display defined in claim 11, wherein the reflective anode structure is formed from a silver alloy that includes the silver and wherein the transparent anode structure is formed from indium tin oxide.

13. The display defined in claim 11, wherein the transparent anode structure is formed from a material and wherein the conductive portion is formed from the material.

14. The display defined in claim 11, wherein a center-to-center spacing between each pair of adjacent reflective anode structures is less than 5 microns and wherein the reflective anode structure has a reflectance above 94% for light between 400 nanometers and 700 nanometers.

15. The display defined in claim 11, wherein the plurality of pixels includes red pixels, green pixels, and blue pixels, wherein the distance between the reflective anode structure and the cathode for the red pixels has a first magnitude, wherein the distance between the reflective anode structure and the cathode for the green pixels has a second magnitude, wherein the distance between the reflective anode structure and the cathode for the blue pixels has a third magnitude, wherein the first magnitude is greater than the second magnitude, and wherein the second magnitude is greater than the third magnitude.

16. The display defined in claim 11, wherein the plurality of pixels includes red pixels, green pixels, and blue pixels, wherein a thickness of the dielectric spacer for the red pixels has a first magnitude, wherein a thickness of the dielectric spacer for the green pixels has a second magnitude, wherein a thickness of the dielectric spacer for the blue pixels has a third magnitude, wherein the first magnitude is greater than the second magnitude, and wherein the second magnitude is greater than the third magnitude.

17. The display defined in claim 11, wherein the reflective anode structures for the plurality of pixels are formed in a dielectric layer, wherein the dielectric layer is formed over a silicon layer that includes transistors, and wherein each one of the reflective anode structures is electrically connected to one of the transistors in the silicon layer.

* * * * *